United States Patent
Huang

(10) Patent No.: US 11,920,254 B2
(45) Date of Patent: Mar. 5, 2024

(54) DETECTION OF CONTACT FORMATION BETWEEN A SUBSTRATE AND CONTACT PINS IN AN ELECTROPLATING SYSTEM

(71) Applicant: Taiwan Semiconductor Manufacturing Co., Ltd., Hsinchu (TW)

(72) Inventor: Yung Chang Huang, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/460,500

(22) Filed: Aug. 30, 2021

(65) Prior Publication Data

US 2023/0065723 A1  Mar. 2, 2023

(51) Int. Cl.
*C25D 21/12* (2006.01)
*C25D 7/12* (2006.01)
(Continued)

(52) U.S. Cl.
CPC ............. *C25D 21/12* (2013.01); *C25D 7/123* (2013.01); *C25D 17/001* (2013.01); *C25D 17/06* (2013.01); *H01L 21/2885* (2013.01)

(58) Field of Classification Search
CPC ............ C25D 7/12–123; C25D 17/001; H01L 21/2885; H01L 21/76873
See application file for complete search history.

(56) References Cited

U.S. PATENT DOCUMENTS 7,015,116 B1  3/2006  Lo et al.
8,962,400 B2  2/2015  Tsai et al.
(Continued)

FOREIGN PATENT DOCUMENTS

TW   201331424 A   8/2013
TW   201905245 A   2/2019
(Continued)

OTHER PUBLICATIONS

Tan, Philip B.Y. et al., "Measuring STI Stress Effect on CMOS Transistor by Stepping Through the Channel Width", *Int'l RF and Microwave Conference Proceedings*, Sep. 12-14, 2006, Putrajaya, Malaysia, pp. 1-3.

(Continued)

*Primary Examiner* — Hosung Chung
(74) *Attorney, Agent, or Firm* — Sterne, Kessler, Goldstein & Fox P.L.L.C.

(57) ABSTRACT

The present disclosure relates to an electroplating system including a first contact detection sensor and a second contact detection sensor disposed at a surface of a cone of the electroplating system. The first contact detection sensor detects a first resistance at a first contact between a substrate to be plated by the electroplating system and a first contact pin, the second contact detection sensor detects a second resistance at a second contact between the substrate and a second contact pin. A controller receives the first resistance and the second resistance, and determines the first contact and the second contact are not properly formed when a difference between the first resistance and the second resistance is not within a first predetermined resistance range, or the first resistance or the second resistance is not within a second predetermined resistance range.

20 Claims, 11 Drawing Sheets

(51) Int. Cl.
    *C25D 17/00*     (2006.01)
    *C25D 17/06*     (2006.01)
    *H01L 21/288*     (2006.01)

(56) References Cited

U.S. PATENT DOCUMENTS

| | | |
|---|---|---|
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,812,363 B1 | 11/2017 | Liao et al. |
| 9,859,380 B2 | 1/2018 | Lee et al. |
| 2001/0040098 A1* | 11/2001 | Okase ................. C25D 17/001 205/82 |
| 2014/0077279 A1 | 3/2014 | Tu |
| 2015/0270122 A1 | 9/2015 | Tolle et al. |
| 2015/0348966 A1 | 12/2015 | Zhao et al. |
| 2016/0049335 A1 | 2/2016 | Liu et al. |
| 2016/0148932 A1 | 5/2016 | Fujita et al. |
| 2016/0308048 A1 | 10/2016 | Ching et al. |
| 2017/0250183 A1 | 8/2017 | Brunco |
| 2020/0018659 A1* | 1/2020 | Huang ................. H01L 21/6838 |

FOREIGN PATENT DOCUMENTS

| | | |
|---|---|---|
| TW | 201920781 A | 6/2019 |
| TW | 202006880 A | 2/2020 |

OTHER PUBLICATIONS

Luo, J-X. et al., "The Impact of Shallow-Trench-Isolation Mechanical Stress on the Hysteresis Effect of Partially Depleted Silicon-on-Insulator n-Type Metal-Oxide-Semiconductor Field Effects", Chin. Phys. Lett., vol. 31, No. 12, pp. 126601-122604, 2014.

Yang, W. et al., "Analysis of GIDL Dependence on STI-induced Mechanical Stress", IEEE, pp. 769-772, 2005.

* cited by examiner

DETECTION OF CONTACT FORMATION BETWEEN A SUBSTRATE AND CONTACT PINS IN AN ELECTROPLATING SYSTEM

BACKGROUND

With advances in semiconductor technology, there has been an increasing demand for higher storage capacity, faster processing systems, higher performance, and lower costs. To meet these demands, the semiconductor industry continues to scale down the dimensions of semiconductor devices. Such scaling down has increased the complexity of semiconductor manufacturing processes and the demands for the precision of features in semiconductor manufacturing systems.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
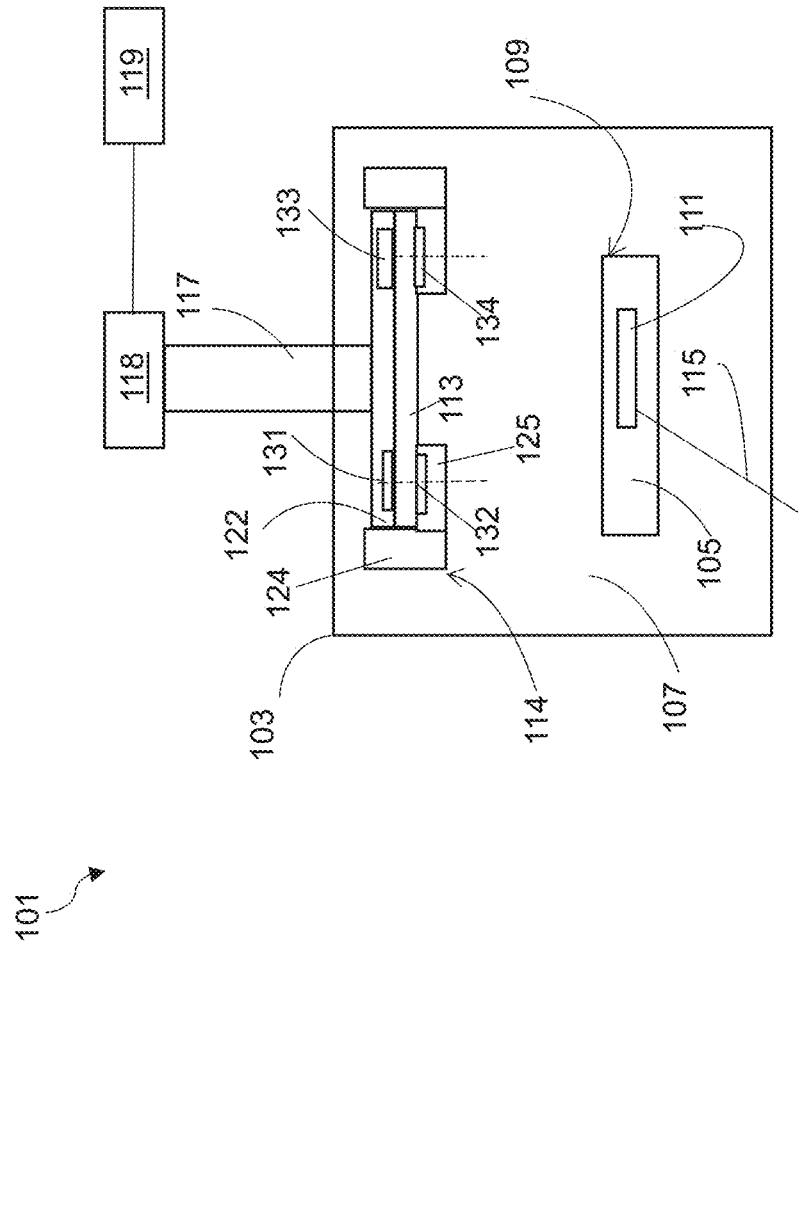
FIGS. 1A-1D illustrate cross-sectional views of an electroplating system with an array of contact detection sensors, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows can include embodiments in which the first and second features are formed in direct contact, and can also include embodiments in which additional features can be formed between the first and second features, such that the first and second features may not be in direct contact. As used herein, the formation of a first feature on a second feature means the first feature is formed in direct contact with the second feature. In addition, the present disclosure can repeat reference numerals and/or letters in the various examples. This repetition does not in itself dictate a relationship between the various embodiments and/or configurations discussed.

Spatially relative terms, such as "beneath," "below," "lower," "above," "upper," and the like can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

It is noted that references in the specification to "one embodiment," "an embodiment," "an example embodiment," "exemplary," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value f e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Electroplating is a process that uses an electric current to reduce dissolved metal cations at an electrode, e.g., an anode, so that they form a thin coherent metal coating on another electrode, e.g., a cathode. The term "electroplating" is also used for electrical oxidation of anions on to a solid substrate. Electroplating is primarily used to change the surface properties of an object, to build up thickness on undersized parts, or to form objects by electroforming. During electroplating, both anode and cathode are immersed in a solution called an electrolyte (or plating bath) containing one or more dissolved metal salts as well as other ions that permit the flow of electricity. An electroplating circuit is formed by the anode, the cathode, and the electrolyte. The part to be plated is the cathode. In some embodiments, the anode is made of the metal to be dissolved and plated onto the cathode, hence the anode is sometimes referred to as sacrificial metal. A power supply provides a direct current to the anode, oxidizing the metal atoms of the anode and allowing them to dissolve in the solution. At the cathode, which can be a substrate, the dissolved metal ions in the electrolyte solution are reduced at the interface between the solution and the cathode, such that they "plate out" onto the cathode. In semiconductor fabrication process, electroplating can be applied to plate a wafer or a substrate by copper or other metal. The substrate or wafer to be plated is submerged into an electrolyte as a cathode, and copper is used as an anode. A current is applied between the cathode and the anode so that copper ions can migrate and deposit onto regions with a pre-existing metal seed layer on the wafer.

An electroplating system can include an electroplating compartment having an anode chamber containing an anode, and a cathode chamber containing a plating bath. A substrate can be submerged into the plating bath as a cathode to be plated. The substrate can be a semiconductor substrate having trenches etched on its surface for Damascene processing, wafer-level packaging, and/or packages including holes to form through-silicon-vias (TSV). The electroplating system can further include holding fixtures including a substrate holder and a cone, which are both rotatable to move and/or support the substrate to be plated. The cone can be used to load the substrate onto the substrate holder. When loading, the cone can be in an open position and can press down on the backside of the substrate, and can place the substrate onto the substrate holder to support the substrate during electroplating. After loading, the cone can be in a closed position, and the substrate holder can be closed to seal the substrate at its periphery against a lip seal of the substrate holder. The substrate holder can further include an array of contact pins. A contact can be formed between the substrate and a contact pin to supply the substrate with electric charge via a power supply of the electroplating system during electroplating so that the substrate can act as a cathode.

However, due to various reasons, e.g., repeated usage of the substrate holder, uneven pressure of the cone, poor contacts may be formed between the substrate and the array of contact pins. Poor contacts can refer to uneven or poorly formed contacts between the substrate and the army of contact pins, or no contact formed between the substrate and some of the contact pins. As a result, the substrate being plated can have an unevenly distributed plated layer on the surface of the substrate, which can cause performance degradation to the substrate or result in a damaged substrate. It is desirable to detect poor contacts formed between the substrate and the array of contact pins.

The present disclosure provides example electroplating systems that can detect uneven or poor contacts between the substrate to be plated and the array of contact pins of the substrate holder. In some embodiments, the cone of the electroplating system includes an array of contact detection sensors. A contact detection sensor can detect a resistance of a contact formed between the substrate and a contact pin disposed below the contact detection sensor. A controller can be coupled to a first contact detection sensor and a second contact detection sensor, and can be configured to receive a first resistance detected by the first contact detection sensor and a second resistance detected by the second contact detection sensor. The controller can be further configured to determine that the first contact and the second contact are proper contacts (also referred to as "good contacts") when a difference between the first resistance and the second resistance is within a first predetermined resistance range. In addition, the controller is configured to determine the first contact and the second contact are proper contacts when the first resistance and the second resistance are smaller than a predetermined resistance or within a second predetermined resistance range. Moreover, the controller is configured to report a poor contact when the first resistance or the second resistance is not within the second predetermined resistance range, or the difference between the first resistance and the second resistance is not within the first predetermined resistance range.

In some embodiments, the controller can determine and/or report whether the contacts are properly formed between the substrate to be plated and the array of contact pins of the substrate holder when the cone is in the closed position, and the substrate holder is closed, before electroplating operations start. In some other embodiments, the controller can determine and/or report whether the contacts formed between the substrate to be plated and the array of contact pins of the substrate holder during electroplating operations in real time to improve plating performance and prevent substrate damages.

FIGS. 1A-1D illustrate cross-sectional views of an electroplating system 101 having an array of contact detection sensors including contact detection sensors 131 and 133, which are disposed on a surface of a cone 122, in accordance with some embodiments. The array of contact detection sensors can include two or more contact detection sensors and can be arranged in a circular configuration (not visible in FIGS. 1A-1D, shown in FIGS. 2A-2B and 3A-3D) or in other geometric configuration. Contact detection sensors 131 and 133 can be configured to detect good contact formation between a substrate 113 to be plated and an array of contact pins including contact pins 132 and 134 of a substrate holder 114 in electroplating system 101. Though two contact pins 132 and 134 are shown for simplicity, the array of contact pins can include two or more contact pins and can be arranged in a circular configuration (not visible in FIGS. 1A-1D, shown in FIG. 1E) or in other geometric configuration. FIGS. 1E-1F illustrate isometric views of a portion of electroplating system 101. The discussion of elements in FIGS. 1A-1F with the same annotations applies to each other, unless mentioned otherwise.

In some embodiments, as shown in FIGS. 1A-1F, electroplating system 101 can include an electroplating compartment 103. FIG. 1F shows vacuum compatible electroplating compartment 103 in isometric view. Electroplating compartment 103 provides a vacuum environment in which plating can occur. Electroplating compartment 103 can have an anode chamber with an anode 111 and a cathode chamber with a plating bath to electroplate substrate 113. Plating bath 107 can also be referred to as electrolyte bath, electrolyte, bath, plating solution, or simply catholyte. Plating bath 107 can be circulated between cathode chamber and a catholyte reservoir (not shown). Plating bath 107 can include various chemicals, such as $CuSO_4$, HCl, $H_2O$, $Cu^{2+}$, $Cl^-$, $H^+$, accelerator, suppressor, leveler, and other chemicals.

In some embodiments, the anode chamber can be formed by a chemical transport barrier 109 enclosing anode 111. The anode chamber can further include an anolyte solution 105 associated with anode 111. Anode 111 can be made from either a sacrificial metal such as copper or a dimensionally stable metal such as titanium or platinum. An anodic potential is applied to anode 111 via an anode electrical connection 115. In some embodiments, anode electrical connection can include a lead formed from a corrosion resistant metal such as titanium or tantalum. Barrier 109 can be porous membrane and can be used to maintain a separate chemical and/or physical environment in anode chamber and cathode chamber. Barrier 109 can be designed to largely prevent non-ionic organic species from entering the anode chamber.

In some embodiments, substrate 113 can be loaded into electroplating system 101 and submerged into plating bath 107 so that substrate 113 can function as a cathode to be plated. Substrate 113 can be a semiconductor wafer, a wafer substrate, or a partially fabricated integrated circuit. Substrate 113 can have a diameter of about 200 mm, about 300 mm, or about 450 mm. Substrate 113 can be in any of many stages of integrated circuit fabrication process, e.g., having trenches etched on its surface for Damascene processing. Hence, electroplating system 101 can be used in a variety of applications including damascene interconnects, wafer-level packaging (WLP), through-silicon-via (TSV), and electroless deposition (ELD). In addition to plating substrate 113, electroplating system 101 can be used to plate other work pieces or articles such as printed circuit boards, and the like. The work pieces can be of various shapes, sizes, and materials.

As shown in FIG. 1A, electroplating compartment 103 further includes holding fixtures, e.g., substrate holder 114 and cone 122, which are both rotatable to move and/or support substrate 113. In some embodiments, there can be multiple holding fixtures to support multiple substrates (not shown). Substrate holder 114 is also referred to as a clamshell assembly. In some embodiments, as shown in FIGS. 1A-1F, substrate holder 114 can include a cup 124 having a cup bottom 125 and a lip seal 123 (shown in FIG. 1B) mounted on cup bottom 125. Cup 124 can be supported by cup struts (not shown). The array of contact detection sensors including contact detection sensors 131 and 133 can be disposed on a surface of cone 122, e.g., a bottom surface of cone 122, a recessed surface on cone 122, or an embedded surface of cone 122. In some embodiments, contact detection sensors 131 and 133 can be at least partially embedded in cone 122 within a recess.

In some embodiments, as shown in FIG. 1A, a shaft 117 coupled to an actuator 118 can move substrate holder 114 and cone 122 along a Z-axis (up and down vertically) or rotate. Actuator 118 can be controlled by a controller 119. Shaft 117 can be referred to as a cone cylinder and actuator 118 can be referred to as a rotate motor. Electroplating system 101 can further include a substrate tilt assembly (not shown) to tilt substrate 113 with respect to a horizontal plane along a Y-axis and an X-axis. These elements can work together to control the vertical speed, angle and rate of rotation of substrate 113 during plating.

Figure 1B:
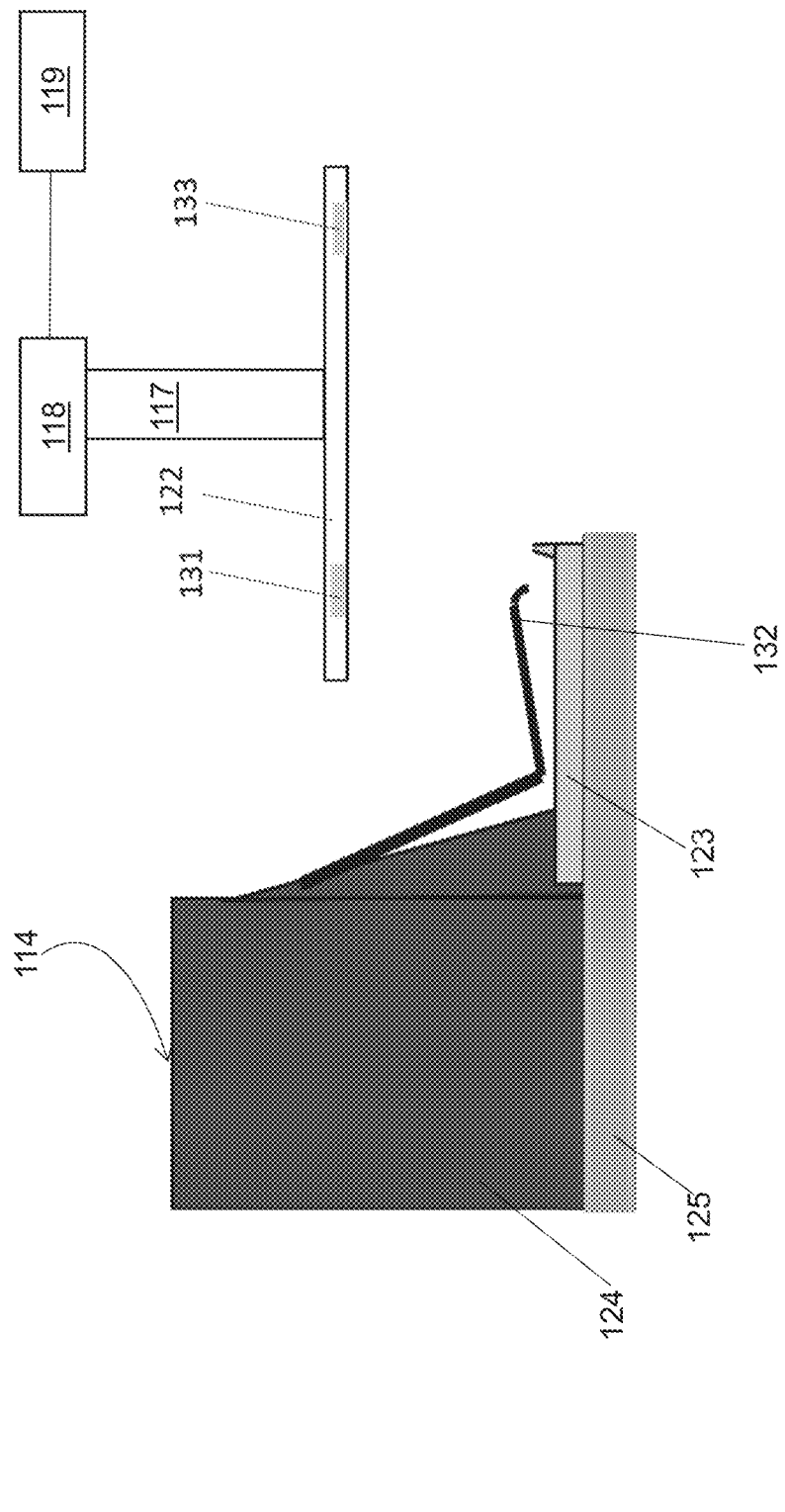
Figure 1C:
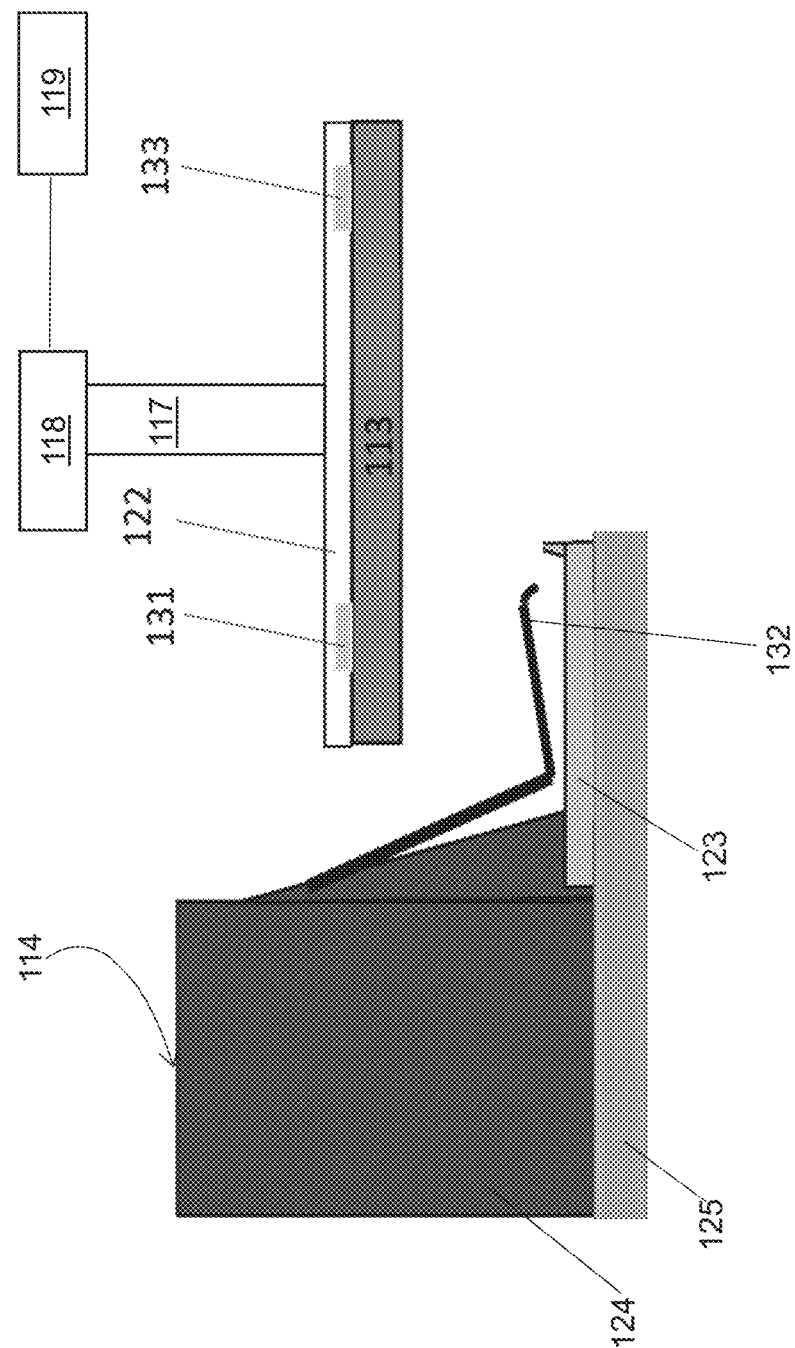
Figure 1D:
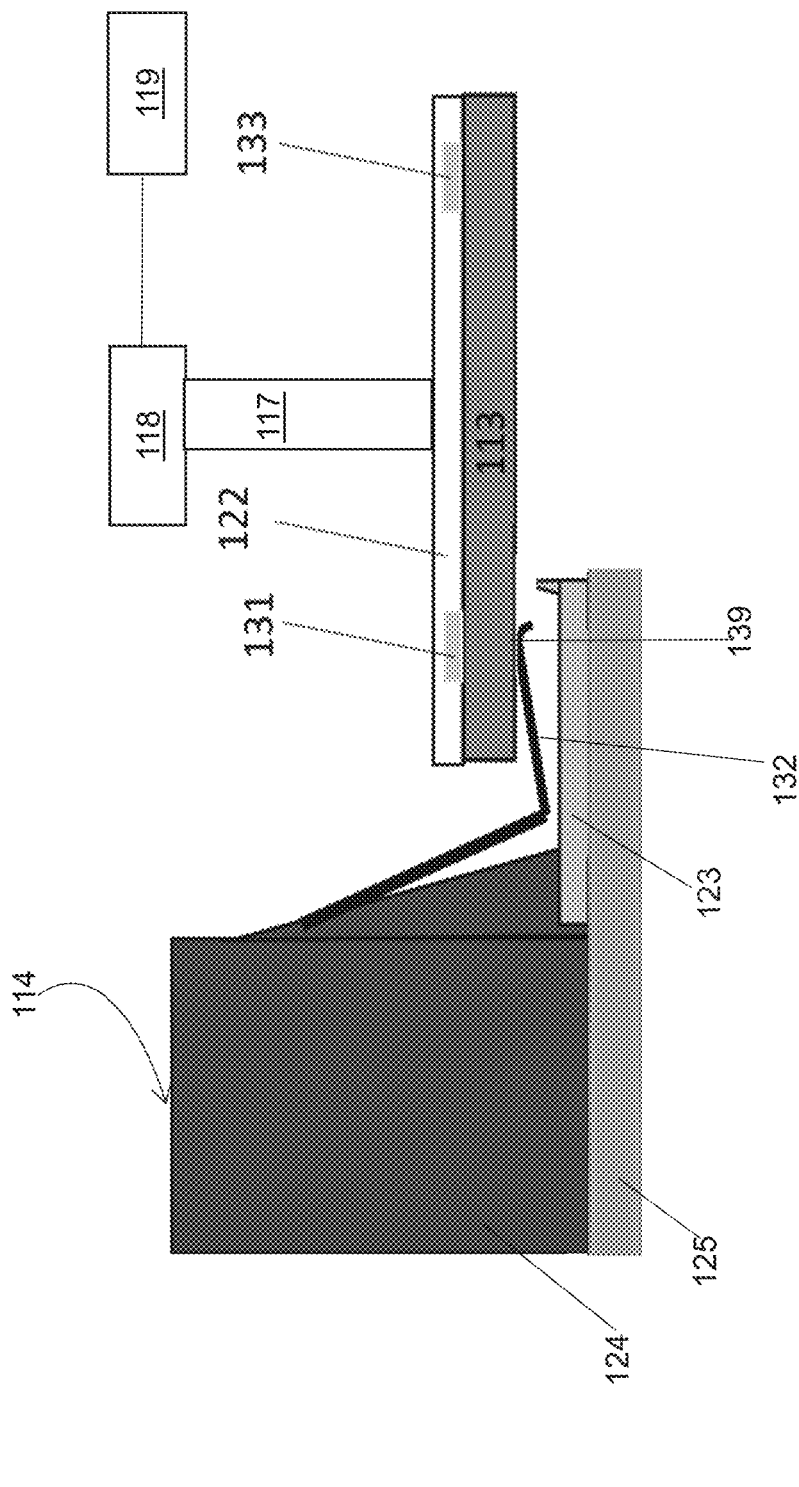
Figure 1E:
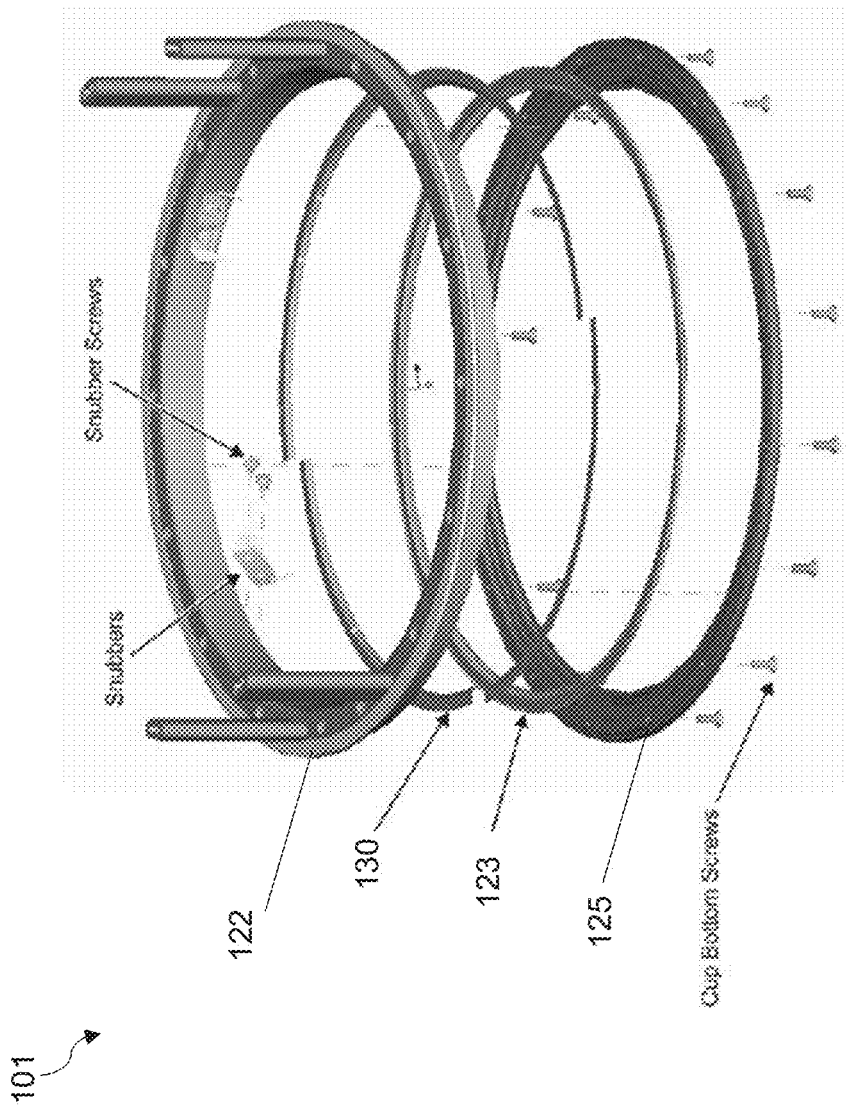
FIGS. 1E-1F illustrate isometric views of an electroplating system with an array of contact detection sensors, in accordance with some embodiments.
Figure 1F:
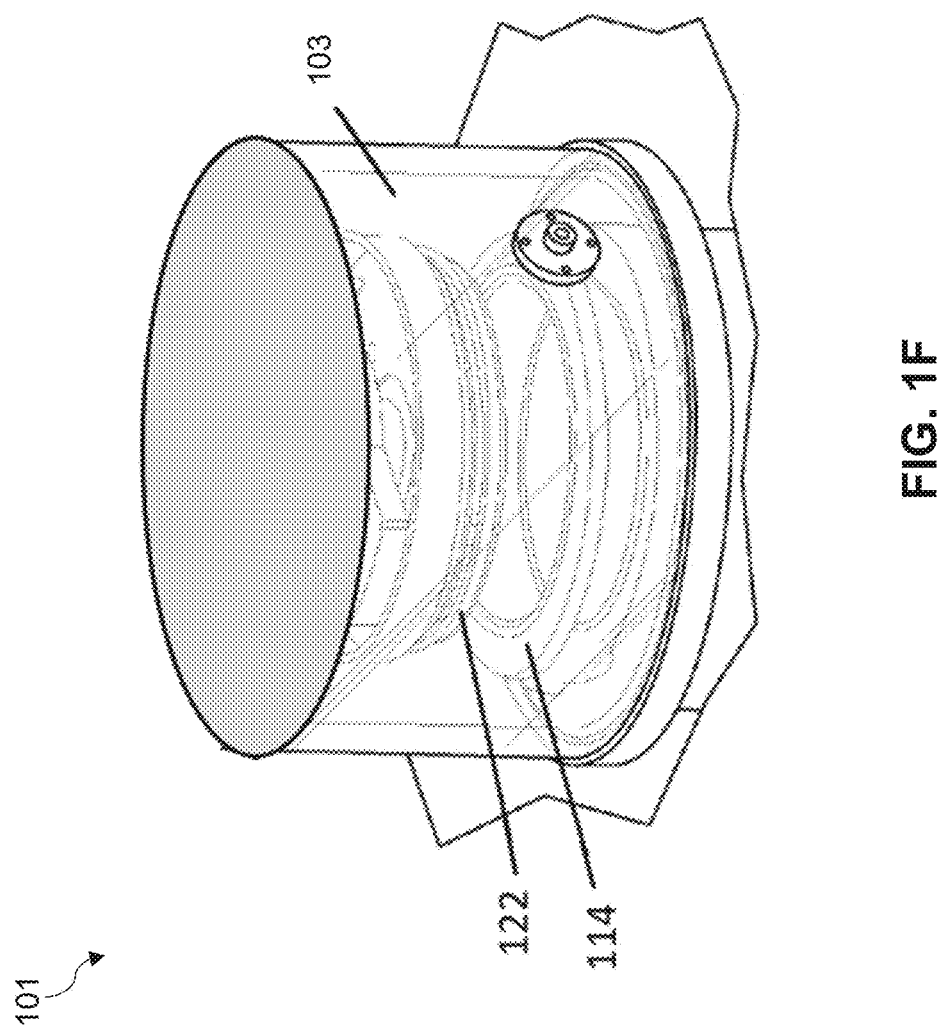

FIGS. 1B-1D illustrate a portion of substrate holder 114 and contact pin 132 with additional details and all elements of FIG. 1A are not shown in FIGS. 113-1D for simplicity. As shown in FIG. 1B in cross-sectional view with more details, cone 122 is in a retracted, up or open position and substrate holder 114 is in an open configuration, while substrate 113 is not loaded onto substrate holder 114. Substrate holder 114 can include lip seal 123 mounted on cup bottom 125. Contact pin 132 can be formed as an electrical contact finger attached to cup 124, but other shapes/types of electrical leads are also possible for supplying electrical current to substrate 113. The portion of substrate holder 114 with contact pin 134 not shown in FIGS. 1B-1D for simplicity. In some embodiments, there can be about 500 to about 600 contact pins. The array of contact pins can form contact pin layer 130 (shown in FIG. 1E) disposed above lip seal 123.

As shown in FIG. 1C in cross-sectional view with more details of loading substrate 113, cone 122 can press down on the backside of substrate 113 to secure substrate 113. Cone 122 can be movable relative to cup 124 and lip seal 123 to place substrate 113 onto substrate holder 114. Substrate 113 can be loaded into electroplating system 101, placed on substrate holder 114 horizontally oriented along a Y-axis and an X-axis. While being secured by cone 122, substrate 113 can be rotated around shaft 117 that passes through its center and is perpendicular to the plating surface of substrate 113.

As shown in FIG. 1D in cross-sectional view, cone 122 can place substrate 113 onto substrate holder 114, above lip seal 123 and contact pin 132. Cone 122 is said to be in a closed position as shown in FIG. 1D. A contact is formed between contact pin 132 and substrate 113 when substrate 113 is physically in touch with contact pin 132. For example, when substrate 113 is pressed into lip seal 123, contact 139 is formed when substrate 113 is in touch with contact pin 132. Contact pin 132 supply substrate 113 with electric charge via a power supply of electroplating system 101 during an electroplating operation so that substrate 113 can become a cathode.

After loading substrate 113, substrate holder 114 can be closed to seal substrate 113 at its periphery against lip seal 123, Once substrate 113 is resting on lip seal 123, cup struts can be compressed (e.g., moved through cone 122). Hence, cup 124 and cone 122 move towards each other in order to press the bottom surface of cone 122 against the back surface of substrate 113 so that the periphery of the other side of substrate 113 (the side to be plated) is pressed against lip seal 123, forming a fluid-tight seal. As a result, the array of contact pins including contact pins 132 and 134 can be protected by the fluid-tight seal formed between substrate 113 and lip seal 123, which keeps electroplating solution off from the backside of substrate 113 and away from contact pins 132 and 134 during electroplating. Contact detection sensors 131 and 133 are in physical contact with the backside of substrate 113.

Before electroplating starts, substrate holder 114 is lowered along a Z-axis into the cathode chamber containing plating bath 107 so that the working surface of substrate 113 (the downward surface) is lowered below the fluid level of plating bath 107. Substrate holder 114 supports the substrate 113 during the immersion into plating bath 107.

During electroplating, an electrical field is established between anode 111 and substrate 113 that functions as a cathode. Controller 119 controls a power supply to provide electrical power through contact pin 132 or 134 to substrate 113 during electroplating. For example, controller 119 can apply a constant cathodic potential or current to substrate 113 before and during immersion in order to protect the seed layer from dissolving. This electrical field drives positive ions from anode chamber through barrier 109 and cathode chamber and onto substrate 113. At substrate 113, an electrochemical reaction takes place in which positive metal ions are reduced to form a solid layer of metal on the surface of substrate 113. In some embodiment, the metal ions are copper ions and copper metal is deposited into the patterned trenches on substrate 113.

To achieve uniform electroplating on the surface of substrate 113, power has to be supplied to substrate 113 uniformly through the array of contact pins including contact pins 132 and 134 in contact pin layer 130 (FIG. 1E). However, contact pins 132 and 134 may not have proper contact with substrate 113. Such uneven contact can be caused by uneven pressure of cone 122 or by some other reasons, e.g., damages to the contact pins from repeatedly usage. Cone 122 holds substrate 113 to be in contact with contact pin 132. The pressure of cone 122 onto substrate 113 can be unevenly distributed, resulting in uneven contact between substrate 113 and the array of contact pins in contact pin layer 130.

In some embodiments, contact detection sensors 131 and 133 can be in contact with substrate 113 to detect resistance values, or resistances of the contacts formed between contact pins 132 and 134 and substrate 113. Each contact detection sensor in the array of contact detection sensor can correspond to each contact pin in the array of contact pins to detect the resistance between each contact pin and substrate 113. Thus, in some embodiments, the number of contact pins can be equal to the number of contact detection sensors. Controller 119 can be coupled to contact detection sensors 131 and 133, and can be configured to receive a resistance for a contact formed when substrate 113 is in touch with a contact pin in contact pin layer 130, such as contact pins 132 and 134. For example, controller 119 receives a resistance for contact 139 formed between substrate 113 and contact pin 132.

In some embodiments, controller 119 can further determine whether the contacts formed between contact pins 132 and 134 and substrate 113 function properly based on the received resistances of contacts detected by contact detection sensors 131 and 133 of cone 122. For example, contact detection sensor 131 can detect whether contact 139 formed between contact pin 132 and substrate 113 is proper. When contact pin 132 and substrate 113 function properly to form contact 139, the resistance detected by contact detection sensor 131 can be in a range of about 200 mohm to about 500 mohm. When contact 139 is formed at a plunger point of substrate holder 114, the resistance detected by contact detection sensor 131 can be in a range of about 950 mohm to about 1200 mohm. Such ranges of resistance are provided as examples only. For different systems, the range of resistance can be different. For example, a resistance at a plunger spot can be about 1.5 times to about 4 times of a resistance at a normal point of substrate holder 114. If contact pin 132 is damaged, substrate 113 may not be in touch with contact pin 132, and as a result contact 139 may not be properly formed. In such a case, the resistance for contact 139 formed between contact pin 132 and substrate 113 can be larger or smaller than a normal resistance.

In some embodiments, detecting resistance at a single contact cannot accurately predict the operation status of substrate 113. When cone 122 unevenly presses substrate 113, e.g., with a tilted degree, substrate 113 may be in touch with some contact pins and not in touch with some other contact pins in contact pin layer 130. The array of contact pins in contact pin layer 130 can detect the different resistance values between substrate 113 and various contact pins, so that controller 119 can have a more accurate assessment of the operations of plating substrate 113, which is described in further detail with reference to FIGS. 2A-2F.

Figure 2A:
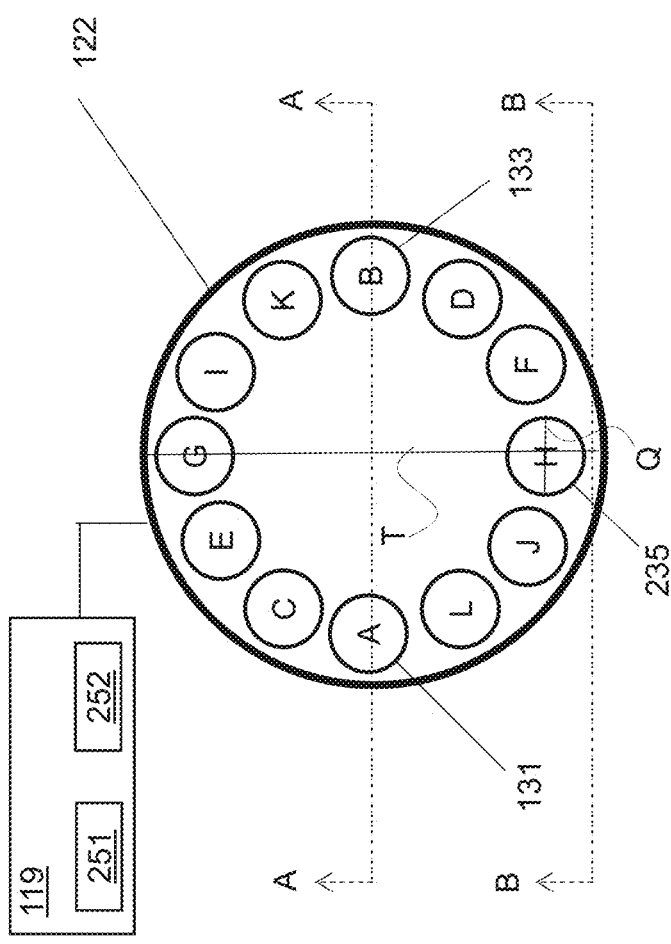
FIG. 2A illustrates a top down view of an array of contact detection sensors of an electroplating system, in accordance with some embodiments.
Figure 2B:
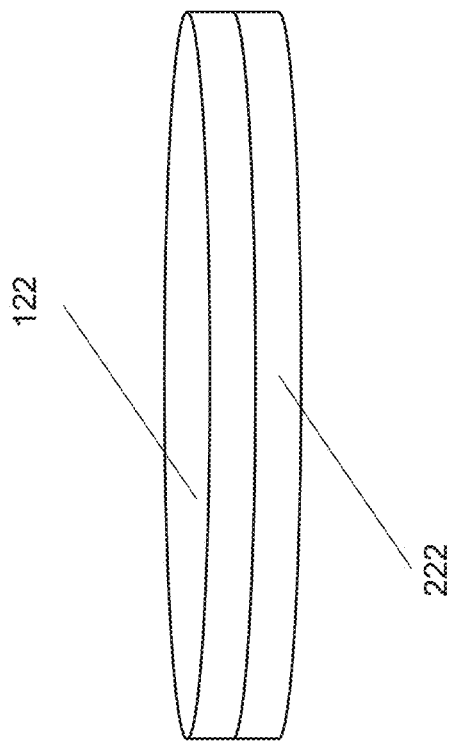
FIG. 2B illustrates a three-dimensional view of a portion of a cone of an electroplating system and a board attached to the cone, where an array of contact detection sensors can be disposed on the surface of the board, in accordance with some embodiments.
Figure 2D:
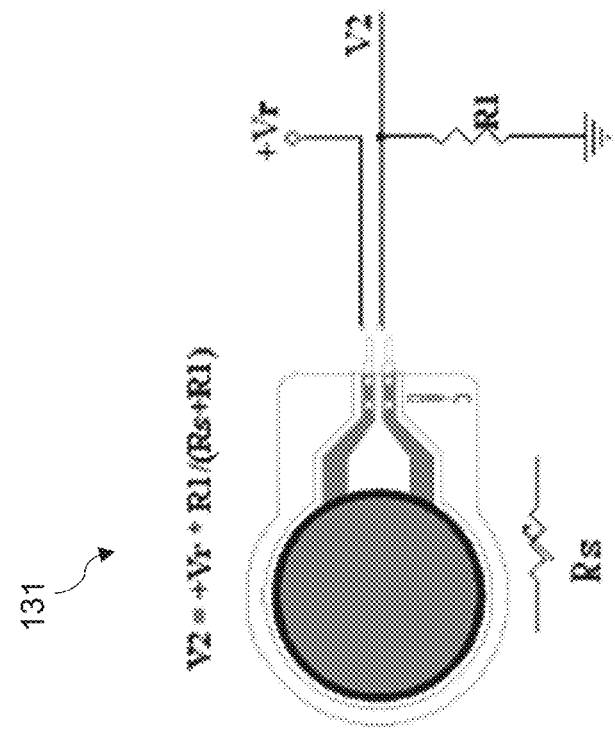
FIG. 2C-2D illustrate dimensional parameters and an electrical circuit of an example contact detection sensor, in accordance with some embodiments.
Figure 2C:
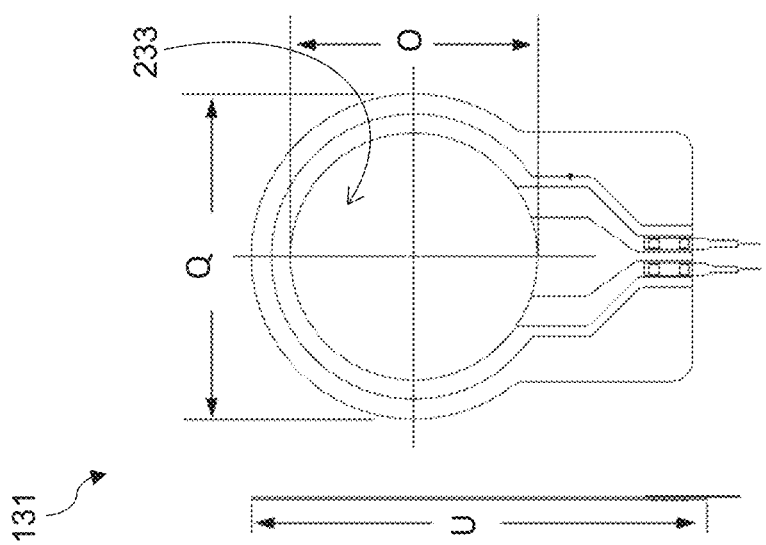
Figure 2E:
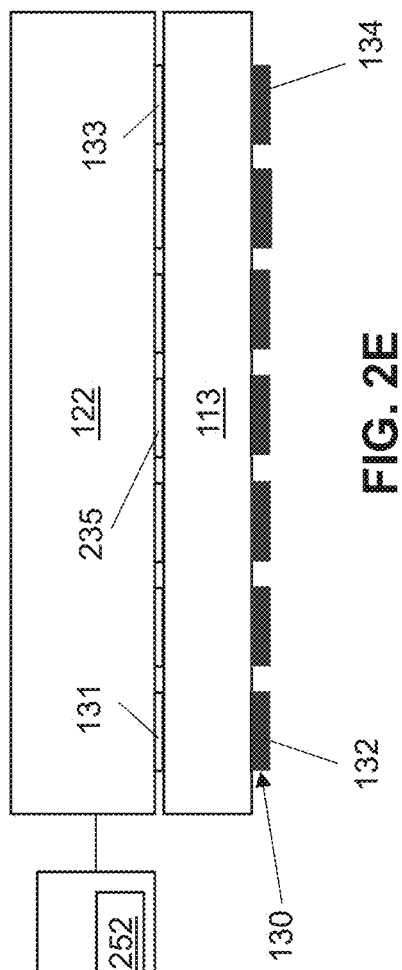
FIGS. 2E-2F illustrate cross-sectional views of an array of contact detection sensors of an electroplating system, in accordance with some embodiments.
Figure 2E:
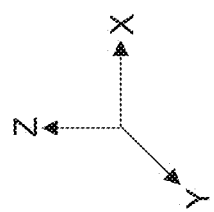
Figure 2F:
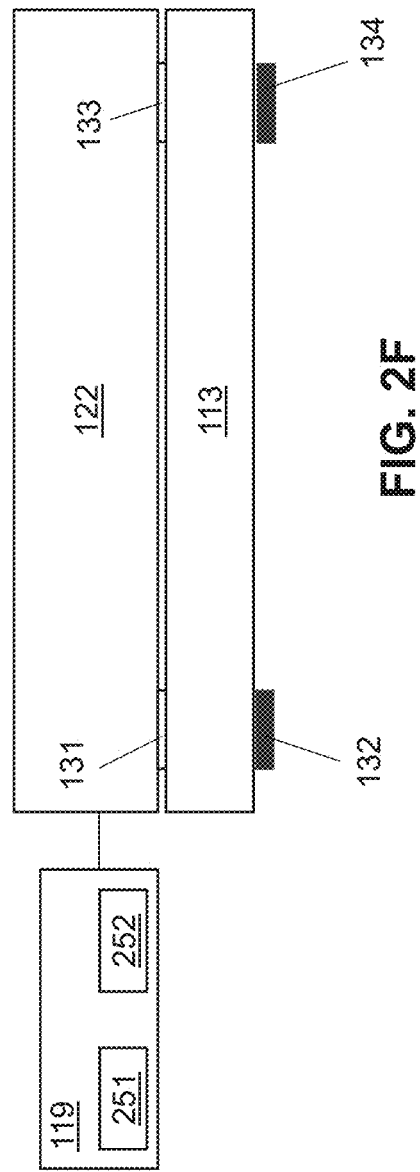
Figure 2F:
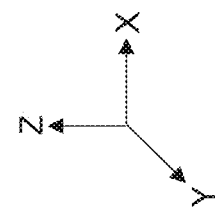

FIG. 2A illustrates a top down view of the array of contact detection sensors disposed on the surface of cone 122 to detect proper contact formation between substrate 113 to be plated and the array of contact pins of substrate holder 114 in electroplating system 101, in accordance with some embodiments. Additionally and alternatively, FIG. 2B illustrates a three-dimensional view of a portion of cone 122 and a board 222 attached to cone 122, where the array of contact detection sensors can be disposed on the surface of board 222. FIG. 2C-2D illustrate dimensional parameters and an electrical circuit of a contact detection sensor. FIGS. 2E-2F illustrate cross-sectional views of the array of contact detection sensors disposed on the surface of cone 122. The discussion of elements in FIGS. 1A-1F and 2A-2F with the same annotations applies to each other, unless mentioned otherwise.

In some embodiments, as shown in FIG. 2A, electroplating system 101 can include cone 122, which can include the array of contact detection sensors in respective locations A-L. Though twelve contact detection sensors are shown in FIGS. 2A, the array of contact detection sensors can include any number of contact detection sensors. For simplicity, contact detection sensors 131, 133, and 235 are discussed. The discussion of contact detection sensors 131, 133, and 235 applies to other contact detection sensors of the array of contact detection sensors, unless mentioned otherwise. Each of contact detection sensors in locations A-L can have a diameter Q and cone 122 can have a diameter T. In some embodiments, diameter Q can be in a range of about 1% to about 2% of diameter T. This range of diameter Q allows the placement of an adequate number of contact detection sensors on cone 122 for detecting proper contact formation between substrate 113 and the array of contact pins of contact pin layer 130 without compromising the detection sensitivity of the contact detection sensors. In some embodiments, the diameters of the contact detection sensors can be similar to or different form each other. The array of contact detection sensors can be disposed along the edge of cone 122 in positions A-L and are coupled to controller 119, which can include a receiver 251 and a processor 252.

In some embodiments, additionally and alternatively, FIG. 2B illustrates a three-dimensional view of a portion of cone 122 and board 222 attached to cone 122, where the array of contact detection sensors can be disposed on the surface of board 222, not shown. Board 222 can be made of a plastic material, a fiberglass material, or other high strength materials. Board 222 can have a height of about 1 mm to about 2 mm, and a radius of about 145 mm to about 155 mm. In general, board 222 has a radius slightly smaller than a radius of cone 122. Compared to board 222, the cone is often a larger component, and hence harder to make its surface flat. By attaching board 222 to cone 122, and further the array of contact detection sensors disposed on the surface of board 222, electroplating system 101 can reduce the potential uneven contact caused by cone 122.

FIG. 2C-2D illustrate dimensional parameters and an electrical circuit of a contact detection sensor, e.g., contact detection sensor 131. The details of contact detection sensor 131 shown in FIG. 2C-2D are applicable to any other contact detection sensors, e.g., contact detection sensor 133, contact detection sensor 235, or other contact detection sensors. As shown in FIG. 2C, contact detection sensor 131 can include a hollow circle with an inner diameter O and external diameter Q (also shown in FIG. 2A). Contact detection sensor 131 can further have a filler 233 to fill the hollow circle. In some embodiments, inner diameter O can be in a range of about 25 millimeters (mm) to about 30 mm, external diameter Q can be in a range of about 30 mm to about 33 mm, and length U can be in a range of about 40 mm to about 45 mm. These dimensions are examples, and are not limiting. In some embodiments, external diameter Q can be about 1.1 to about 1.5 times of inner diameter O, and length U can be about 1.1 to about 1.5 times of Q. These dimension ranges allow the placement of an adequate number of contact detection sensors on cone 122 for detecting proper contact formation between substrate 113 and the array of contact pins of contact pin layer 130 without compromising the detection sensitivity of the contact detection sensors.

In some embodiments, as shown in FIG. 2D, contact detection sensor 131 can use a fixed resistor R1 in a voltage divider configuration for an output voltage V2 that increases with respect to detected resistance Rs, according to the formula $V2=Vr*R1/(Rs+R1)$. Since voltage Vr and resistance R1 are known, by measuring voltage V2, detected resistance Rs can be deduced based on the formula V2. Hence, contact detection sensor 131 can detect the resistance of the contact formed.

FIGS. 2E-2F show cross-sectional views of cone 122, substrate 113, the array of contact detection sensors, and the array of contact pins along respective lines A-A and B-B of FIG. 2A. In some embodiments, as shown in FIGS. 2E-2F, contact detection sensor 131 can be vertically above a first contact formed between substrate 113 and contact pin 132. Similarly, contact detection sensor 133 can be vertically above a second contact formed between substrate 113 and contact pin 134. Contact detection sensor 131 can be configured to detect a first resistance of the first contact formed between substrate 113 and contact pin 132, while contact detection sensor 133 can be configured to detect a second resistance of the second contact formed between substrate 113 and contact pin 134. The detected first resistance and second resistance can be input to controller 119.

Referring back to FIG. 2A, in some embodiments, contact detection sensors 131 and 133 in respective positions A and B are referred to be in symmetric positions with respect to a line of symmetry (not shown) of cone 122. Two contact detection sensors are in symmetric positions with respect to the line of symmetry of cone 122 when a line connecting the centers of two contact detection sensors passes through the line of symmetry of cone 122. Besides, contact detection sensors 131 and 133, pairs of contact detection sensors in positions C-D, E-F, G-H, I-J, and K-L are in symmetric positions with respect to the lines of symmetry of cone 122.

When substrate 113 is in an even position, resistances detected by two contact detection sensors in symmetric positions can be correlated, or close to each other. Hence, the difference between the resistances detected by two contact detection sensors in symmetric positions are within the first predetermined resistance range. For example, if contact detection sensor 131 at location A detects the first resistance of the first contact between substrate 113 and contact pin 132 to be X ohm, and contact detection sensor 133 at location B detects the second resistance of the second contact between substrate 113 and contact pin 134 to be Y ohm, the difference between X and Y ohms are within the first predetermined resistance range, for the first and second contacts to be good contacts. If one of the contacts is formed around a plunger spot of substrate holder 114, then the difference between X and Y ohms can be within another predetermined resistance range for the first and second contacts to be good contacts.

The contact detection sensors in positions A-L can detect resistances of multiple contacts formed between substrate 113 and the array of contact pins in contact pin layer 130. Controller 119 can include receiver 251 to receive all the resistances. In addition, controller 119 can include processor 252 to determine whether contacts formed between substrate 113 and the array of contact pins of substrate holder 114 work properly when substrate 113 is loaded onto substrate holder 114.

In some embodiments, controller 119 or processor 252 of controller 119 can determine whether a resistance of a single contact formed between substrate 113 and one of the contact pins in contact pin layer 130 is smaller than the predetermined resistance, or within the second predetermined resistance range. For example, a single contact formed between substrate 113 and one of the contact pins in contact pin layer 130 can have a resistance R ohm. If resistance R ohm is not within the second predetermined resistance range, or not smaller than the predetermined resistance, controller 119 can output a signal to indicate the presence of a poor contact. On the other hand, if every resistance of contacts formed between substrate 113 and the contact pins in contact pin layer 130 is within the second predetermined resistance range, or smaller than the predetermined resistance, controller 119 can output a signal to indicate the presence of good contacts between substrate 113 and contact pin layer 130 and to start the electroplating process on substrate 113.

In addition, controller 119 can determine a first contact and a second contact formed between substrate 113 and contact pins corresponding to contact detection sensors in symmetric positions, such as at positions A-B, C-D, E-F, G-H, I-J, or K-L are proper contacts when a difference between the first resistance X ohm for the first contact and the second resistance Y ohm for the second contact is within the first predetermined resistance range. For example, controller 119 can determine the first contact and the second contact are proper contacts when the difference between X and Y ohms (i.e., |X-Y|) is within the first predetermined resistance range. In some embodiments, when the difference between resistances measured by every pair of contact detection sensors in symmetric positions A-B, C-D, E-F, G-H, I-J, and K-L are within first predetermined resistance range, controller 119 can output a signal to indicate the presence of good contacts between substrate 113 and the contact pins of contact pin layer 130. On the other hand, when a difference of resistance between resistances detected by contact detection sensors at any of symmetric positions A-B, C-D, E-F, G-H, I-J, or K-L is outside the first predetermined resistance range, controller 119 can output a signal to indicate that a poor contact is formed between substrate 113 and contact pin layer 130. In some embodiments, controller 119 can be configured to indicate the presence of a poor contact when the first resistance is greater than or equal to the predetermined resistance, the second resistance is larger than or equal to the predetermined resistance, or the difference between the first resistance and the second resistance is not within the second predetermined resistance range.

In some embodiments, controller 119 can further control some or all of the operations of the electroplating system. Controller 119 can include one or more memory devices and one or more processors. The processor 252 can include a central processing unit (CPU) or computer, analog and/or digital input/output connections, stepper motor controller boards, and other like components. Instructions for implementing appropriate control operations, which are system control software, are executed on the processor 252. These instructions can be stored on the memory devices associated with the controller or they can be provided over a network. The system control software can include instructions for controlling the timing, mixture of electrolyte components, inlet pressure, plating cell pressure, plating cell temperature, wafer temperature, current and potential applied to substrate 113 and any other electrodes, substrate position, wafer rotation, substrate immersion speed, and other parameters of a particular process performed by the electroplating system. In some embodiments, system control software includes input/output control (IOC) sequencing instructions for controlling the various parameters described above. For example, each phase of an electroplating process can include one or more instructions for execution by controller 119. The instructions for setting process conditions for an immersion process phase can be included in a corresponding immersion recipe phase. In some embodiments, the electroplating recipe phases can be sequentially arranged, so that all instructions for a electroplating process phase are executed concurrently with that process phase. The above operations listed are for examples only. Controller 119 can perform any operations needed for the electroplating system.

FIGS. 3A-3D illustrate top down views of different configurations of array of contact detection sensors on cone 322, according to various embodiments. The discussion of cone 122 of FIGS. 1A-1F and 2A-2F applies to cone 322, unless mentioned otherwise. The discussion of the array of contact detection sensors of FIGS. 1A-1F and 2A-2F applies to the array of cone detections sensors of FIGS. 3A-3D, unless mentioned otherwise. The discussion of elements in FIGS. 1A-1F, 2A-2F, and 3A-3D with the same annotations applies to each other, unless mentioned otherwise.

Figure 3B:
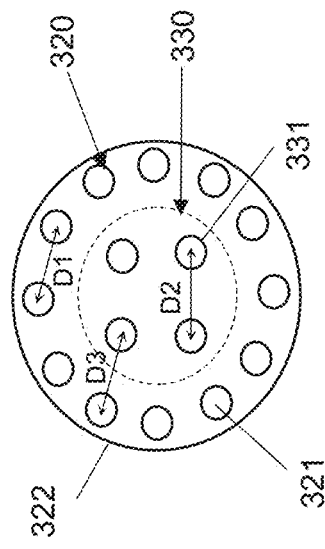
FIGS. 3A-3D illustrate top down view of an array of contact detection sensors of an electroplating system, in accordance with some embodiments.
Figure 3D:
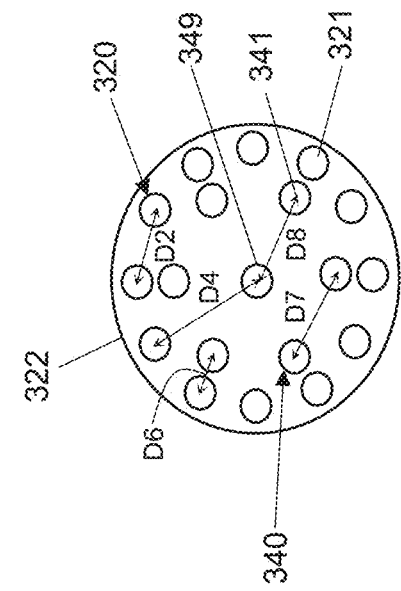
Figure 3A:
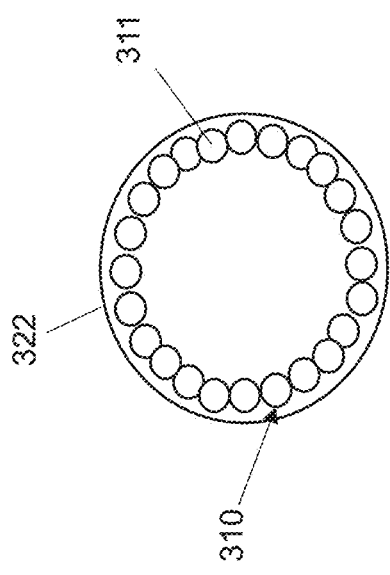

In some embodiments, as shown in FIG. 3A, an array 310 of contact detection sensors 311 can be disposed in a circular configuration on a surface of cone 322 along the edge of cone 322. Contact detection sensors 311 can be vertically above contacts formed between substrate 113 and contact pins in contact pin layer 130 to detect resistances of the contacts. Contact detection sensors 311 can be coupled to a controller similar to controller 119 shown in FIGS. 1A-1D and FIGS. 2A-2F. The controller can determine the status of the contacts, that is whether the contacts are good or bad based on the resistances detected by the contact detection sensors 311.

In some embodiments, as shown in FIG. 3B, a first array 320 of contact detection sensors 321 and a second array 330 of contact detection sensor 331 can be disposed in a circular and rectangular configuration, respectively, on a surface of cone 322 along the edge of cone 322. First and second arrays 320-330 can include any number of contact detection sensors 321-331.

Contact detection sensors 321 can be vertically above contacts formed between substrate 113 and contact pins in contact pin layer 130 to detect a resistances of the contacts. First array 320 of contact detection sensors 321 can be coupled to controller 119 shown in FIGS. 1A-1D and FIGS. 2A-2F. In addition, contact detection sensors 331 can be configured to detect additional parameters, such as contact resistances, pressure, and other parameters away from the edge of cone 322. Parameters detected by contact detection sensors 331 can be input to controller 119 for more precise assessment of whether good or bad contacts are formed between substrate 113 and the contact pins of substrate holder 114.

In some embodiments, each pair of adjacent contact detection sensors 321 in first array 320 can be spaced apart from each other by a distance D1, which is measured between centers of adjacent contact detection sensors 321. In some embodiments, each pair of adjacent contact detection sensors 331 in second array 330 can be spaced apart from each other by a distance D2, which is measured between centers of adjacent contact detection sensors 331, In some embodiments, the shortest distance between one of contact detection sensors 321 in first array 320 and one of contact detection sensors 331 in second array 330 can be a distance D3, which is measured between centers of contact detection sensors 321 and 331. For effective measurements and assessments of the contacts, the ratios D1:D2, D1:D3, D2:D3 can range from about 1:4 to about 4:1 (e.g., about 1:4, about 1:3, about 1:2, about 1:1, about 2:1, about 3:1, or about 4:1). The ratios D1:D2, D1:D3, D2:D3 can be equal to or different from each other.

Figure 3C:
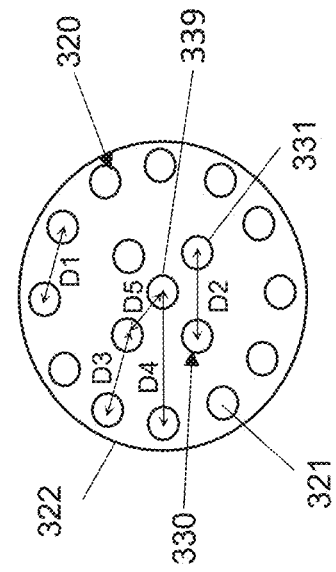

In some embodiments, as shown in FIG. 3C, first array 320 and second array 330 can be arranged on cone 322 as in FIG. 3B. In addition, cone 322 of FIG. 3C can include contact detection sensor 339 disposed at the center of cone 322. Similar to contact detection sensors 331, contact detection sensor 339 can be configured to detect parameters, such as contact resistance, pressure; and other parameters away from the edge of cone 322. Parameters detected by contact detection sensor 339 can be input to controller 119 for more precise assessment of whether good or bad contacts are formed between substrate 113 and the contact pins of substrate holder 114.

In some embodiments, each of contact detection sensors 321 in first array 320 can be spaced apart from contact detection sensor 339 by a distance which is measured between centers of contact detection sensors 321 and 339. In some embodiments, each of contact detection sensors 331 in second array 330 can be spaced apart from contact detection sensor 339 by a distance D5, which is measured between centers of contact detection sensors 331 and 339. For effective measurements and assessments of the contacts, distance D4 is greater than distance D5, the ratios D1:D4 and D2:D5 can range from about 1:2 to about 1:4, and the ratios D3:D5 can range from about 1:3 to about 3:1 (e.g., about 1:3, about 1:2; about 1:1, about 2:1; or about 3:1).

In some embodiments, as shown in FIG. 3D, first array 320 and contact detection sensor 349 can be arranged on cone 322 as in FIG. 3C. In addition, cone 322 of FIG. 3D can have a third array 340 of contact detection sensors 341 disposed on cone 322 in a circular configuration. First and third arrays 320 and 340 can be concentrically arranged. Both first and third arrays can be disposed vertically above contacts formed between substrate 113 and contact pins arranged in two arrays similar to first and third arrays 320 and 340 to detect resistances of the contacts. The additional array of contact pins and contact detection sensors can improve the accuracy and precise assessment of whether good or bad contacts are formed between substrate 113 and the contact pins of substrate holder 114.

The number of contact detection sensors 321 in first array 320 can be equal to or different from the number of contact detection sensors 341 in third array 340. In some embodiments, the shortest distance between one of contact detection sensors 321 in first array 320 and one of contact detection sensors 341 in third array 340 can be a distance D6, which is measured between centers of contact detection sensors 321 and 341. In some embodiments, each pair of adjacent contact detection sensors 341 in third array 340 can be spaced apart from each other by a distance D7, which is measured between centers of adjacent contact detection sensors 341. In some embodiments, each of contact detection sensors 341 can be spaced apart from contact detection sensor 339 by a distance D8, which is measured between centers of contact detection sensors 341 and 339. For effective measurements and assessments of the contacts, distance D4 is greater than distances D6 and D8, and the ratios D6:D2 and D6:D7 can range from about 1:2 to about 1:4.

Figure 4:
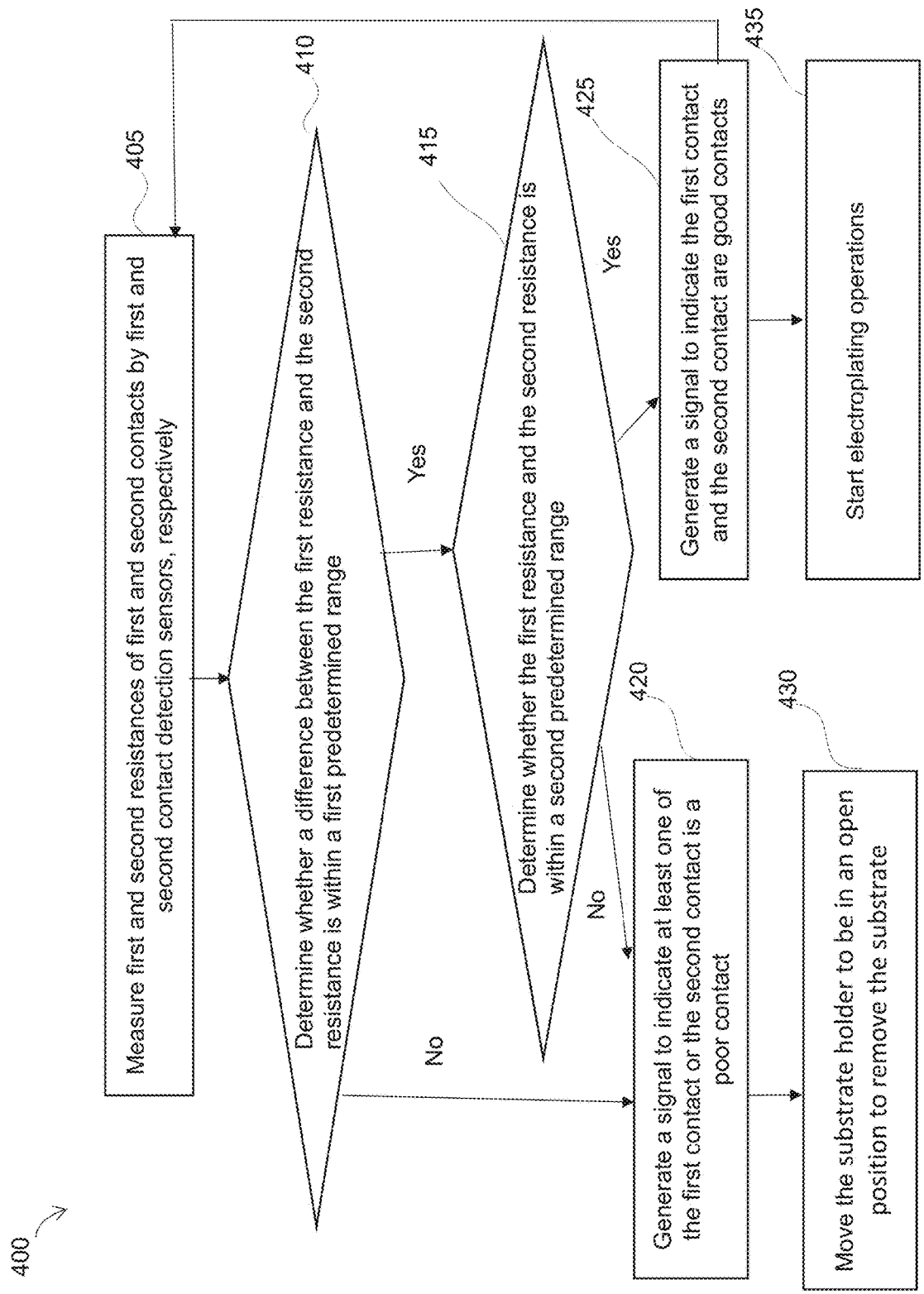
FIG. 4 is a flow diagram of a method for using an electroplating system with an array of contact detection sensors, in accordance with some embodiments.

FIG. 4 is a flow chart of a method 400 performed by electroplating system 101, in accordance with some embodiments. This disclosure is not limited to this operational description. Rather, other operations are within the spirit and scope of the present disclosure. It is to be appreciated that additional operations can be performed. Moreover, not all operations can be needed to perform the disclosure provided herein. Further, some of the operations can be performed simultaneously, or in a different order than shown in FIG. 4. In some implementations, one or more other operations can be performed in addition to or in place of the presently described operations. For illustrative purposes, method 400 is described with reference to the embodiments of FIGS. 1A-1F, 2A-2F, or FIG. 3A-3D.

In some embodiments, method 400 can be performed when the cone (e.g., cone 122 or 322) of electroplating system 101 is in the closed position and substrate holder 114 is closed, before electroplating operations start. In some other embodiments, method 400 can be performed during electroplating operations in real time to improve plating performance and prevent substrate damages. Before method 400 is performed, a substrate, e.g., substrate 113 is loaded into a substrate holder, e.g., substrate holder 114, by a cone, e.g., cone 122 or 322, as demonstrated in FIGS. 1A-1D.

In operation 405 of FIG. 4, the first and second resistances of the first and second contacts are measured by first and second contact detection sensors, respectively. For example, as shown and discussed with reference to FIGS. 2A-2F, first and second resistances are measured by contact detection sensors 131 and 133. The measured first and second resistances are input to controller 119. The first resistance is for the first contact formed between substrate 113 and contact pin 132, while the second resistance is for the second contact formed between substrate 113 and contact pin 134.

In operation 410 of FIG. 4, a difference between the first resistance and the second resistance is compared with a first predetermined resistance range to determine whether the difference is within the first predetermined resistance range. For example, as shown and discussed with reference to FIGS. 2A-2F, controller 119 can determine the first contact and the second contact are proper contacts when the difference between the first resistance X ohm and the second resistance Y ohm is within the first predetermined range.

In operation 420 of FIG. 4, when the difference between the first resistance and the second resistance is not within the first predetermined resistance range, a signal can be generated to indicate at least one of the first contact or the second contact is a poor contact. As a result, controller 119 can generate a signal to indicate that at least one of the contacts measured by contact detection sensors is a poor contact. When a poor contact is determined, the process can move to operation 430. In operation 430 of FIG. 4, the substrate holder can be moved to an open position to remove the substrate. Other operations can be performed to further diagnosis the poor contacts and make any needed repairs.

In operation 415 of FIG. 4, when the difference between the first resistance and the second resistance is within the first predetermined resistance range, the first resistance and the second resistance are compared with a second predetermined resistance range to determine whether the first resistance is within the second predetermined resistance range, or the second resistance is within the second predetermined resistance range. If the first resistance or the second resistance is not within the second predetermined resistance range, operation 420 can be performed. As a result, based on the measurement of contact detection sensor, controller 119 can generate a signal to indicate the presence of a poor contact between substrate 113 and the contact pins of contact pin layer 130.

In operation 425 of FIG. 4, when the first resistance and the second resistance are both within the second predetermined resistance range, a signal can be generated to indicate the first contact and the second contact are good contacts. For example, as discussed with reference to FIGS. 2A-2F, controller 119 can generate a signal to indicate the presence of all good contacts for substrate 113 when every resistance of contacts formed between substrate 113 and the contact pins in contact pin layer 130 is within the second predetermined resistance range, or smaller than the predetermined resistance. When all good contacts are determined, the process can move to operation 435. In operation 435 of FIG. 4, electroplating operations can start for the substrate.

In some examples, when the first contact and the second contact are good contacts, method 400 can loop back to operation 405 to test two new contacts to be good contact or not. Such a loop can be performed repetitively until all the contacts formed between a substrate and a contact pin are tested.

The present disclosure provides example electroplating systems (e.g., electroplating system 101) with an array of contact detection sensors that can detect uneven contacts or improper contacts formed between a substrate (e.g., substrate 113) to be plated and an array of contact pins (e.g., contact pins in contact pin layer 130) of a substrate holder (e.g., substrate holder 114). In some embodiments, the array of contact detection sensors are disposed on a cone (e.g., cone 122 and 322) of the electroplating system. The array of contact detection sensors can detect resistances of contacts formed between the substrate and the array of contact pins below the array of contact detection sensors. The electroplating system can include a controller (e.g., controller 119) coupled to the array of contact detection sensors and configured to receive resistances detected by the array of contact detection sensors. The controller can be further configured to determine whether the contacts are good or bad contacts based on the resistances.

In some embodiments, an electroplating system includes an electroplating compartment configured to hold a plating bath. In addition, the electroplating system includes a substrate holder configured to hold a substrate to be plated by the plating bath, where the substrate holder includes a first contact pin and a second contact pin. The first contact pin and the second contact pin are configured to receive power supplied to the substrate during electroplating. Furthermore, the electroplating system includes a cone configured to load the substrate onto the substrate holder. The cone includes a first contact detection sensor and a second contact detection sensor disposed at a surface of the cone. When the cone is in a closed position, a first contact is formed between the substrate and the first contact pin and a second contact is formed between the substrate and the second contact pin. The first and second contact detection sensors are disposed vertically above the first and second contact pins, respectively. Moreover, the first and second contact detection sensors are configured to detect first and second resistances of the first and second contacts, respectively.

In some embodiments, an electroplating system includes an electroplating chamber configured to hold a plating bath. In addition, the electroplating system includes a substrate holder configured to hold a substrate to be plated by the plating bath. The substrate holder includes an array of contact pins configured to receive power during electroplating. Moreover, the electroplating system includes a cone configured to load the substrate onto the substrate holder. The cone includes a first array of contact detection sensors disposed on a surface of the cone. Contacts are formed between the substrate and the array of contact pins. The first array of contact detection sensors are disposed vertically above the array of contact pins and are configured to measure resistances of the contacts. In addition, the electroplating system includes a controller coupled to the first array of contact detection sensors and configured to receive the measured resistances. Furthermore, a processor is coupled to the controller and configured to determine differences between a predetermined value and the resistances and to determine a status of the contacts based on the differences.

In some embodiments, a method performed by an electroplating system includes measuring, by a first contact detection sensor, a first resistance between a first contact pin and a substrate to be plated by an electroplating system; and measuring, by a second contact detection sensor, a second resistance between the substrate and a second contact pin.

The first contact pin and the second contact pin are disposed on a substrate holder and the first contact detection sensor and the second contact detection sensor are disposed on a surface of a cone of the electroplating system. In addition, the method includes comparing, by a controller, a predetermined resistance range with the first and second resistances; and generating, by the controller, a comparison result based on the comparing. Moreover, the method includes outputting, by the controller, a signal to indicate a status of a first contact and a second contact. The first contact is formed between the first contact pin and the substrate and the second contact is formed between the substrate and the second contact pin based on the comparison result.

The foregoing disclosure outlines features of several embodiments so that those skilled in the art can better understand the aspects of the present disclosure. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure; and that they can make various changes, substitutions; and alterations herein without departing from the spirit and scope of the present disclosure.

What is claimed is:

1. An electroplating system, comprising:
   an electroplating chamber configured to hold a plating bath;
   a substrate holder configured to hold a substrate to be plated by the plating bath, wherein the substrate holder includes a first contact pin and a second contact pin, and wherein the first contact pin and the second contact pin are configured to receive power supplied to the substrate during electroplating; and
   a cone configured to load the substrate onto the substrate holder, wherein the cone comprises a first contact detection sensor and a second contact detection sensor disposed on a surface of the cone, wherein when the cone is in a closed position, a first contact is formed between the substrate and the first contact pin and a second contact is formed between the substrate and the second contact pin, and wherein the first and second contact detection sensors are disposed vertically above the first and second contact pins, respectively, and are configured to detect first and second resistances of the first and second contacts, respectively.

2. The electroplating system of claim 1, further comprising:
   a controller coupled to the first contact detection sensor and the second contact detection sensor, wherein the controller is configured to receive the first resistance and the second resistance and to determine a difference between a predetermined value and the first and second resistances.

3. The electroplating system of claim 2, wherein the controller is configured to determine whether the first contact and the second contact are proper contacts based on the difference between the predetermined value and the first and second resistances.

4. The electroplating system of claim 1, further comprising:
   a controller coupled to the first contact detection sensor and the second contact detection sensor, wherein the controller is configured to determine a first difference between the first and second resistances and to determine a second difference between a predetermined value and the first difference.

5. The electroplating system of claim 1, wherein the first contact detection sensor and the second contact detection sensor are in symmetric positions with respect to a line of symmetry of the cone.

6. The electroplating system of claim 1, wherein the first contact detection sensor and the second contact detection sensor are at least partially embedded in the cone.

7. The electroplating system of claim 1, wherein the first and second contact detection sensors are part of an array of contact detection sensors that are arranged in a circular configuration.

8. The electroplating system of claim 1, wherein the first and second contact detection sensors are part of first and second arrays of contact detection sensors that are concentrically arranged with respect to each other.

9. The electroplating system of claim 1, wherein the first and second contact pins are part of an array of contact pins that are arranged in a circular configuration.

10. The electroplating system of claim 1, wherein the substrate holder further includes a cup bottom, a lip seal disposed above the cup bottom, and wherein the first contact pin and the second contact pin are disposed above the lip seal.

11. The electroplating system of claim 1, wherein the substrate holder further includes a cup, and the first contact pin or the second contact pin is an electrical contact finger attached to the cup.

12. The electroplating system of claim 1, further comprising:
    a shaft coupled to the cone; and
    an actuator, wherein the shaft and the actuator control movements of the cone or the substrate holder.

13. An electroplating system, comprising:
    an electroplating chamber configured to hold a plating bath;
    a substrate holder configured to hold a substrate to be plated by the plating bath, wherein the substrate holder includes an array of contact pins configured to receive power during electroplating;
    a cone configured to load the substrate onto the substrate holder, wherein the cone comprises a first array of contact detection sensors disposed on a surface of the cone, wherein contacts are formed between the substrate and the array of contact pins, and wherein the first array of contact detection sensors are disposed vertically above the array of contact pins and are configured to measure resistances of the contacts;
    a controller coupled to the first array of contact detection sensors and configured to receive the measured resistances; and
    a processor coupled to the controller, wherein the processor is configured to determine differences between a predetermined value and the resistances and to determine a status of the contacts based on the differences.

14. The electroplating system of claim 13, wherein the first array of contact detection sensors are arranged in a circular or a rectangular configuration.

15. The electroplating system of claim 13, wherein the array of contact pins are arranged in a circular or a rectangular configuration.

16. The electroplating system of claim 13, wherein the cone further comprises a second array of contact detection sensors and wherein the first and second arrays of contact detection sensors are concentrically arranged with respect to each other.

17. The electroplating system of claim 13, wherein the cone further comprises a second array of contact detection sensors and wherein the first array of contact detection sensors is arranged in a circular configuration and the second array of contact detection sensors is arranged in a rectangular configuration.

18. The electroplating system of claim 13, wherein a first contact detection sensor and a second contact detection sensor in the first array of contact detection sensors are disposed in symmetric positions with respect to a line of symmetry of the cone.

19. An electroplating system, comprising:
- an electroplating chamber configured to hold a plating bath;
- a substrate holder configured to hold a substrate to be plated in the plating bath, wherein the substrate holder comprises one or more contact pins configured to form one or more contacts with the substrate during electroplating;
- a cone configured to load the substrate onto the substrate holder; and
- one or more contact detection sensors coupled to the cone, wherein the one or more contact detection sensors are configured to detect one or more resistances between the substrate and the one or more contact pins.

20. The electroplating system of claim 19, wherein the two or more contact detection sensors are vertically above the two or more contacts.

* * * * *